United States Patent
Sanchez-Rubio et al.

(10) Patent No.: US 6,192,062 B1
(45) Date of Patent: *Feb. 20, 2001

(54) BEAM COMBINING OF DIODE LASER ARRAY ELEMENTS FOR HIGH BRIGHTNESS AND POWER

(75) Inventors: Antonio Sanchez-Rubio, Lexington; Tso Yee Fan, Belmont, both of MA (US)

(73) Assignee: Massachusetts Institute of Technology, Cambridge, MA (US)

( * ) Notice: Under 35 U.S.C. 154(b), the term of this patent shall be extended for 0 days.

This patent is subject to a terminal disclaimer.

(21) Appl. No.: 09/498,462

(22) Filed: Feb. 4, 2000

Related U.S. Application Data

(63) Continuation-in-part of application No. 09/149,610, filed on Sep. 8, 1998.

(51) Int. Cl.[7] .............................................. H01S 3/08
(52) U.S. Cl. ........................... 372/92; 372/108; 372/98; 372/43; 372/102
(58) Field of Search .......................... 372/92, 98, 108, 372/43, 102; 350/130

(56) References Cited

U.S. PATENT DOCUMENTS

| | | | |
|---|---|---|---|
| 5,526,155 | * 6/1996 | Knox et al. | 359/130 |
| 5,982,803 | * 11/1999 | Sukhman et al. | 372/87 |

* cited by examiner

*Primary Examiner*—Leon Scott, Jr.
(74) *Attorney, Agent, or Firm*—Testa, Hurwitz & Thibeault, LLP

(57) ABSTRACT

The present invention also features an external cavity laser source that includes a free space external cavity comprising a laser array, an optical element, a dispersive element, and a partially reflecting element. The laser array comprises at least two optical gain elements where each of the at least two optical gain elements generate optical radiation having a unique wavelength. The optical element has a focal plane and is positioned to substantially place the focal plane at the at least two optical gain elements and to intercept the generated optical radiation. The dispersive element is positioned substantially at the focal plane of the optical element. The partially reflecting element is positioned to intercept radiation from the dispersive element. The partially reflecting element and the gain elements together forming the free space laser cavity that defines the at least first and second wavelength.

20 Claims, 5 Drawing Sheets

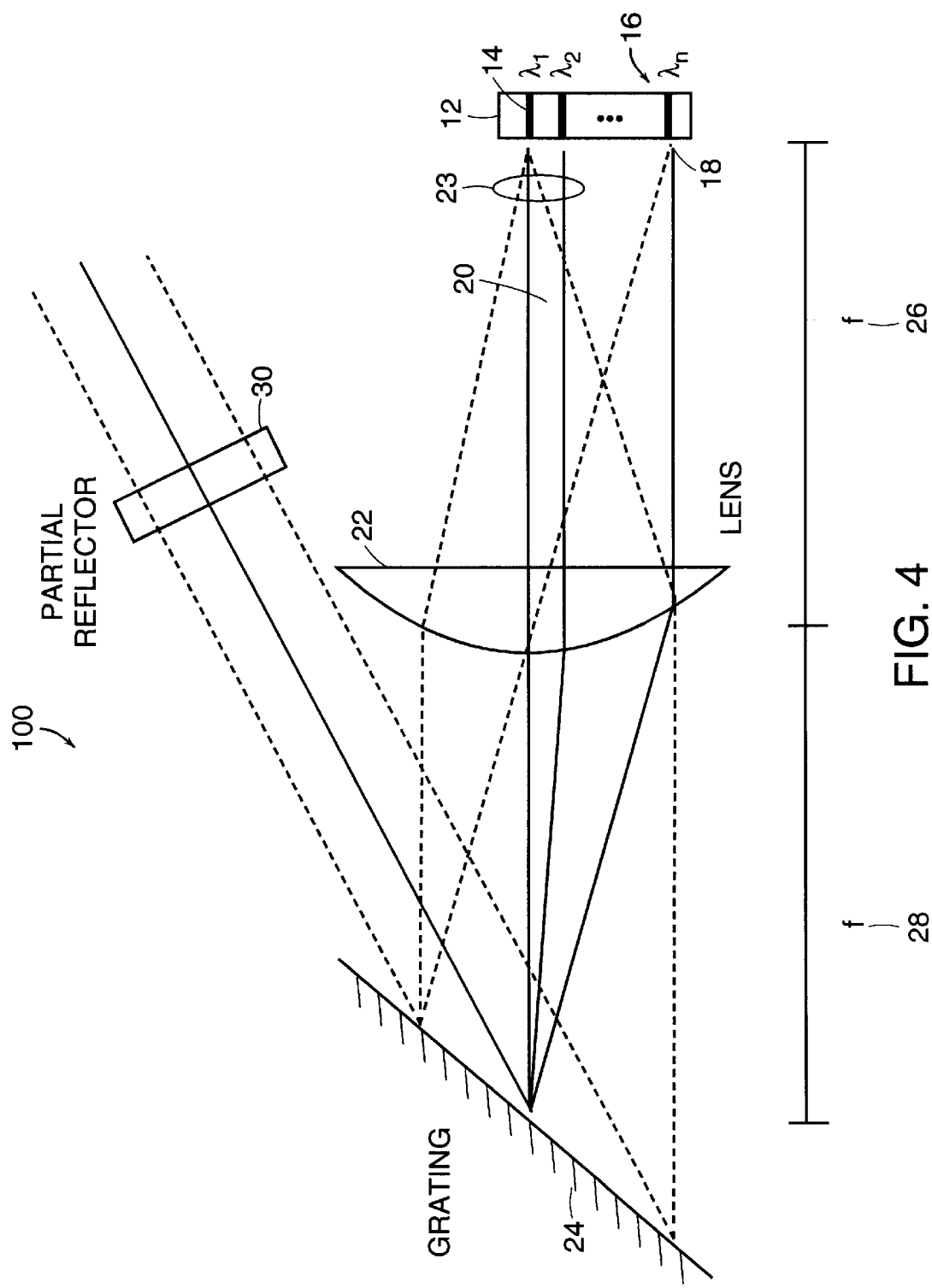

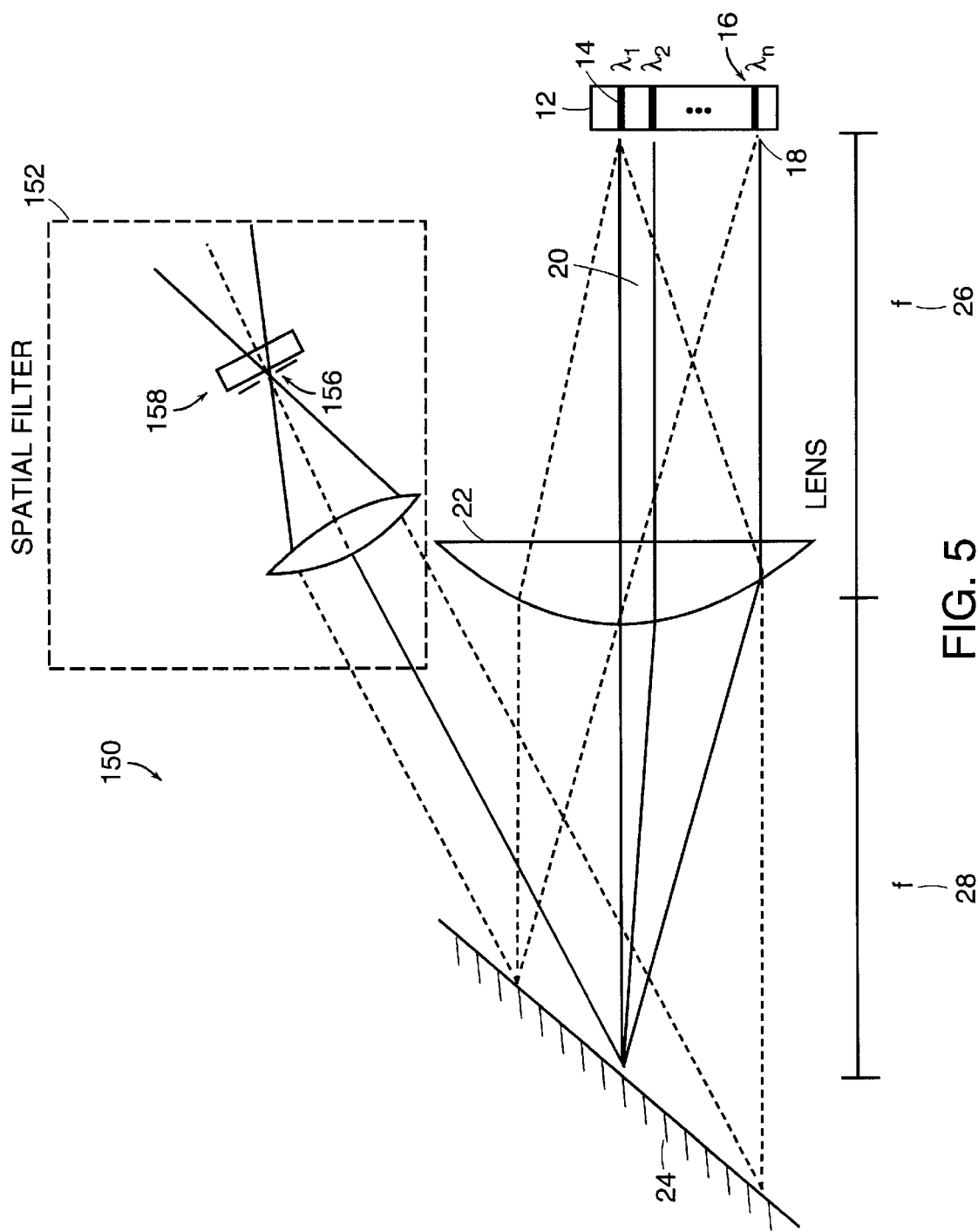

BEAM COMBINING OF DIODE LASER ARRAY ELEMENTS FOR HIGH BRIGHTNESS AND POWER

RELATED APPLICATIONS

This is a continuation-in-part of patent application Ser. No. 09/149,610, filed Sep. 8, 1998, the entire disclosure of which is incorporated herein by reference.

GOVERNMENT SUPPORT

This invention was made with government support under Contract Number F19628-95-C-0002 awarded by the U.S. Air Force. The government has certain rights in the invention.

FIELD OF THE INVENTION

The invention relates generally to the field of external cavity laser sources. In particular, the invention relates to efficient high-power or high-brightness, multi-wavelength external cavity laser sources that use laser arrays and to methods of generating a high-power or high-brightness multi-wavelength overlapping or coaxial optical beam using laser arrays.

BACKGROUND OF THE INVENTION

High-power or high-brightness semiconductor laser sources which have high efficiency are required for a variety of applications including machining, laser pumping and numerous medical procedures. Efficient high brightness semiconductor laser sources are typically achieved by focusing a semiconductor laser beam into an optical fiber having a small etendue (i.e. small product of core diameter and numerical aperture of the fiber).

Prior methods of fiber coupling high-power diode laser arrays, however, require the use of highly multi-mode optical fiber (i.e. large etendue) and, therefore, have relatively low brightness. For example, one commercial product generates 30 Watts of output power from a multi-mode fiber with a core diameter of about 1 mm and a numerical aperture of 0.12.

Numerous other applications require high-power or high-brightness sources. These applications include communications, solid state laser pumping, imaging, printing, and optical switching. Relatively low-power, multi-wavelength integrated and external cavity lasers have been constructed using dispersive elements.

U.S. Pat. No. 5,351,262 to Poguntke et al. describes a multi-wavelength laser having an integrated cavity that is formed on a single substrate. The laser includes a plurality of individually selectable active waveguides, a diffraction grating, and a passive output waveguide. A resonant cavity is formed between the selected active stripe, the diffraction grating, and the passive output waveguide. The geometry of the resonant cavity determines the lasing wavelengths of each of the plurality of active waveguides. The Poguntke laser can only be used to generate relatively low powers because it is integrated on a monolithic substrate and thus has limited heat dissipation.

Farries, et al., *Tunable Multiwavelength Semiconductor Laser with Single Fibre Output,* Electronic Letters, Vol. 27, No. 17, Aug. 15, 1991, describes a low-power multi-wavelength external cavity laser that uses a diffraction grating. The external cavity comprises a monolithic semiconductor laser array, a diffraction grating, and a single mode fiber loop mirror. The loop mirror includes a 50:50 coupler with two output ports that are fusion spliced to form a Sagnac interferometer.

Because the Farries laser is designed for fiber optic communication systems, it comprises a single mode semiconductor laser array and, therefore, it can only be used to generate relatively low powers. In Farries, the element separation in the semiconductor laser array is only ten microns. The resulting output power into the fiber is only approximately 0.5 mW per element. In addition, because the external cavity of Farries laser is not completely a free space laser cavity, it is relatively inefficient.

U.S. Pat. No. 5,115,444 to Kirkby et al. describes a multi-wavelength external cavity and integrated cavity laser that uses a dispersive element. A set of optical cavities having different frequency bands is formed from a set of individually addressable semiconductor laser amplifiers, each having a single reflecting facet. The cavity includes a common dispersive element and a common semiconductor amplifier having a partially reflecting facet. The Kirkby laser can only be used to generate relatively low powers. The Kirkby integrated cavity laser is formed on a monolithic substrate and thus has limited heat dissipation. The Kirkby external cavity laser uses a common semiconductor amplifier through which all optical beams in the cavity must propagate. Because the common amplifier also has limited heat dissipation, the Kirkby external cavity laser can only generate relatively low power.

U.S. Pat. No. 5,379,310 to Papen et al. describes an external cavity multi-wavelength laser that uses a dispersive element. A cavity is formed from a plurality of semiconductor lasers, a dispersive element and a reflective element. The plurality of semiconductor lasers generates a plurality of optical beams which are deflected by the dispersive element onto the reflective element. The combination of the dispersive element and the curved surface imposes a different resonance condition on each semiconductor laser thereby resulting in each laser lasing at a different wavelength. The Papen laser generates a plurality of parallel output beams; each beam having a different wavelength. The Papen laser is designed for relatively low power applications such as communication systems, data storage, and spectroscopy. Because the Papen laser generates a parallel (not overlapping or coaxial) output beam, it has relatively low brightness.

U.S. Pat. No. 4,923,270 to Carter describes a laser source for optical wavelength multiplexing. The laser source includes an optical assembly and a reflection grating for collimating light emitted by a laser and for refocusing the light onto an output waveguide. The output waveguide is a fiber that incorporates an embedded reflector which is displaced from the end of the fiber. Because the cavity of the laser source is not a completely free space laser cavity, the power, efficiency, and brightness of the laser is limited.

SUMMARY OF THE INVENTION

The present invention relates to high-power or high-brightness, multi-wavelength external cavity lasers that generate an overlapping or coaxial beam. The lasers of the present invention are constructed with a plurality of single-transverse-mode gain elements, a lens, a wavelength dispersive element, and a partially reflecting element. It is a principal object of this invention that if such lasers are constructed with single-traverse-mode gain elements that they generate a nearly ideal spatial mode with minimal cross talk. It is another principal object of this invention that a spatial filter is not necessary in such a laser to eliminate cross-talk if the dispersive element is required to be substantially at a focal length away from the lens.

Accordingly, in one embodiment, the present invention features a high-power, external cavity laser source. At least two optical gain elements are positioned in the cavity. Each gain element generates optical radiation having one of at least a first and a second wavelength and one of at least a first and a second free space optical path, respectively.

An optical element is positioned in the cavity such that its focal plane is approximately located at the at least two optical gain media and such that it intercepts the at least two respective free space optical paths. The optical element in one embodiment, includes a refractive element. In another embodiment, the optical element includes a reflective element. A dispersive element is positioned in the at least two optical paths. In one embodiment, the dispersive element includes a grating. In another embodiment, the optical element and the dispersive element includes a single optical element such as a Rowland-circle grating.

Another aspect of this invention is the use of a free space external cavity with no guided-wave elements. Free space cavities are inherently less lossy than those that include guided wave elements, and therefore are more efficient. In addition, free space external cavities are simpler.

A partially reflecting element is also positioned in the at least two optical paths. In one embodiment, the partially reflecting element is an end face of an optical fiber. The partially reflecting element and the gain elements together form a free space laser cavity that defines the at least first and second wavelength. In operation, the partially reflecting element transmits an overlapping or coaxial beam including radiation having the at least first and second wavelength.

The present invention also features a multi-wavelength, free space external cavity laser source. At least two optical fiber gain elements are positioned in at least two respective free space optical paths. In one embodiment, each gain element generates optical radiation having one of at least a first and a second wavelength, respectively. Each of the at least two optical fiber gain elements may generate at least substantially 0.5 Watt of optical radiation.

An optical element is positioned in the cavity such that its focal plane is substantially located at the at least two optical gain elements and such that it intercepts the at least two respective free space optical paths. The optical element in one embodiment includes a refractive element. In another embodiment, the optical element includes a reflective element. A dispersive element is positioned in the at least two optical paths. The dispersive element may in one embodiment include a grating. In one embodiment, the optical element and the dispersive element includes a single optical element such as a Rowland-circle spectrometer grating.

A partially reflecting element is also positioned in the at least two optical paths. In one embodiment, the partially reflecting element is an end face of an optical fiber. The partially reflecting element and the gain elements together form a free space laser cavity that defines the at least first and second wavelength. In operation, the partially reflecting element transmits an overlapping or coaxial beam including radiation having the at least first and second wavelength.

The present invention also features an external cavity laser source that includes a free space external cavity including a laser array, an optical element, a dispersive element, and a partially reflecting element. The laser array includes at least two optical gain elements where each of the at least two optical gain elements generate optical radiation having a unique wavelength. The at least two optical gain elements may include at least two single mode optical gain elements or at least two multi-mode optical gain elements. In one embodiment, the at least two optical gain elements each generate at least 0.5 Watt of optical radiation. The laser array may be a semiconductor laser array or a fiber laser array.

The optical element has a focal plane and is positioned to substantially place the focal plane at the at least two optical gain elements and to intercept the generated optical radiation. The optical element in one embodiment includes a refractive element. In another embodiment, the optical element includes a reflective element. The dispersive element is positioned substantially at the focal plane of the optical element. The dispersive element may be a grating. Positioning of the dispersive element substantially at the focal plane of the optical element reduces cross talk between at least two optical gain elements.

The partially reflecting element is positioned to intercept radiation from the dispersive element. The partially reflecting element includes an end face of an optical fiber. The partially reflecting element and the gain elements together forming the free space laser cavity that defines the at least first and second wavelength. In operation, the partially reflecting element transmits an overlapping beam including radiation having the at least first and second wavelength.

A spatial filter may be positioned in a path of the overlapping beam. The aperture may be an end of an optical fiber and may be a partially reflecting element. An etendue of the spatial filter may be substantially less than or equal to the etendue of the at least two optical gain elements.

BRIEF DESCRIPTION OF THE DRAWINGS

This invention is described with particularity in the appended claims. The above and further advantages of this invention may be better understood by referring to the following description taken in conjunction with the accompanying drawings, in which:

FIG. 4 illustrates a schematic diagram of an embodiment of a multi-wavelength external cavity laser that uses single-transverse-mode gain elements to generate high brightness and high power.

FIG. 5 illustrates a schematic diagram of an embodiment of a multi-wavelength external cavity laser that uses multi-traverse-mode gain elements and a spectral filter to generate a high quality and high brightness beam.

DETAILED DESCRIPTION

Figure 1:
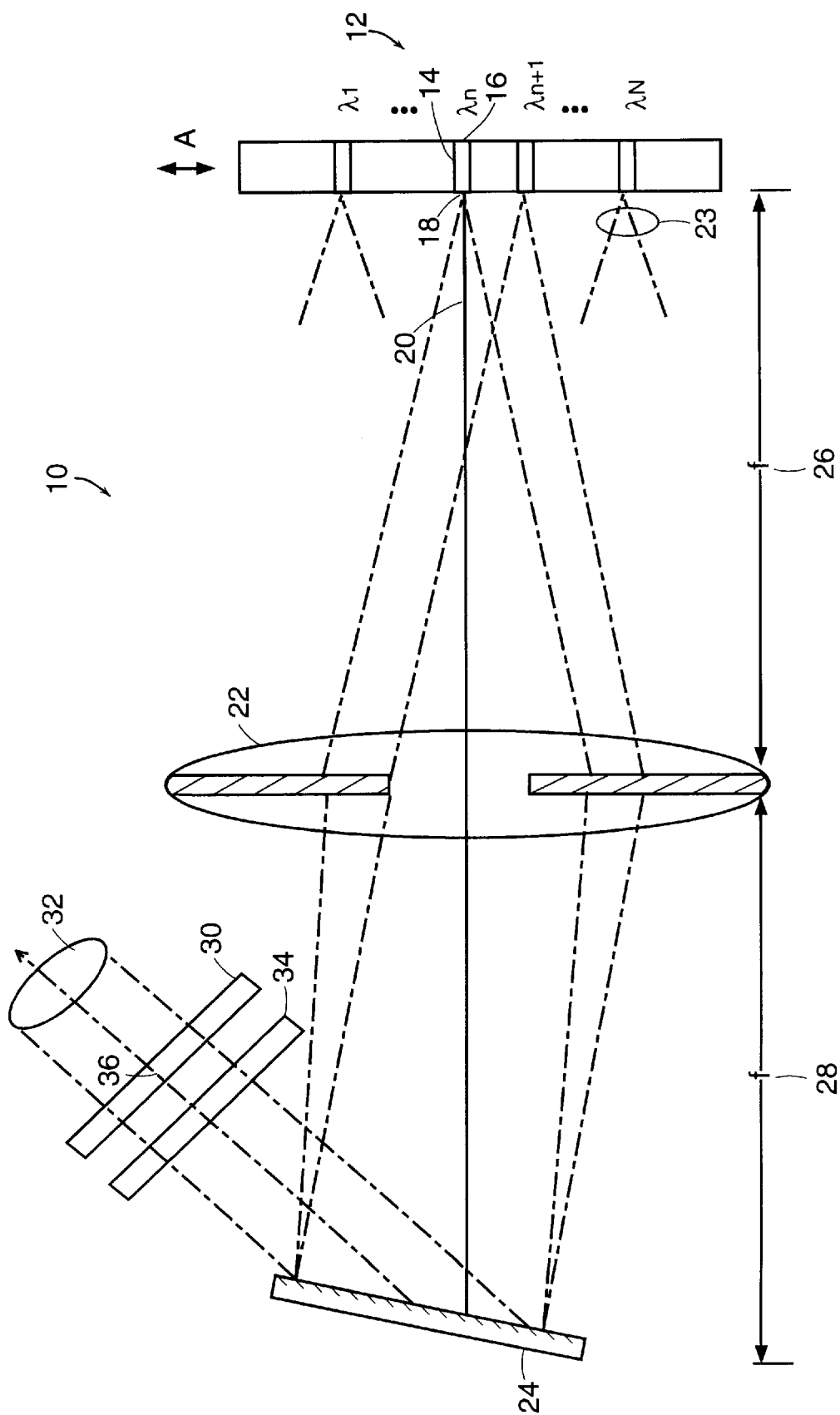
FIG. 1 illustrates a schematic diagram of an embodiment of a multi-wavelength external cavity laser according to the present invention.

FIG. 1 illustrates a schematic diagram of an embodiment of a multi-wavelength external cavity laser 10 according to the present invention. The laser 10 includes an array of optical gain elements 12. The gain elements 14 may be positioned on equal or unequal center-to-center spacing. Positioning the gain elements 14 on unequal spacing may reduce cross talk between the gain elements. Each of the gain elements may be substantially the same or different gain media. Any optical gain media may be used. The gain media must, however, have sufficient gain and sufficient gain bandwidth to overcome optical losses at the desired lasing wavelengths.

In one embodiment, the linear array 12 includes multi-mode semiconductor laser amplifiers having stripes 14 of active gain media. In another embodiment, the array 12 includes a plurality of discrete multi-mode semiconductor amplifiers. In yet another embodiment, the array 12 includes a plurality of fiber amplifiers.

Each array 12 has a reflecting rear face 16 and a substantially antireflective front face 18. In one embodiment, the rear face 16 is substantially totally reflecting. Each of the gain elements 14 emit a beam of radiation in different optical paths 20. An optical element, such as a collimating lens 22, is positioned in the optical paths 20 of the beams. In one embodiment, additional collimating lenses 23 are positioned adjacent to the front face 18 of each gain elements 14. In one embodiment, the optical element includes a curved mirror.

A dispersive element, such as a diffraction grating 24, is also positioned in the optical paths 20. In one embodiment, the lens 22 is positioned at substantially a focal length 26 away from the array 12 and the grating 24 is positioned at substantially a focal length 28 away from the lens 22.

A partially reflective element 30, such as a partial mirror 30, is positioned in the optical paths 20 so that it reflects the optical beams at near normal incidence. The partial mirror 30 reflects a portion of the beams emitted by the array 12 back into the optical paths 20. The partial mirror 30 also transmits a portion of the optical beams emitted by the array 12 out of the laser 10 as an overlapping or coaxial output beam 32.

In one embodiment, a spatial filter 34 is positioned between the grating 24 and the partial mirror 30. The spatial filter 34 may include a lens positioned at substantially a focal length from an aperture 36 at the partial mirror 30. Typically the aperture 36 is dimensioned such that it is substantially the dimensions of the image of one of the gain elements 14. The surface of the partial mirror surrounding the aperture 36 may be absorbing, scattering or transmissive. In operation, the spatial filter 34 passes only those rays that are at near normal incidence to the spatial filter 34. This eliminates cross talk between the gain elements 14.

A resonator is formed by the reflecting surface of the rear face 16 of each of the gain elements 14 and the partial mirror 30. The optical paths 20 of the laser 10 all pass through lens 22 and are all dispersed by grating 24. That is, the optical paths 20 all share lens 22 and grating 24 but pass through only one of the plurality of semiconductor gain elements 14. The overlapping or coaxial output beam 32 propagates normal to the partially reflecting mirror.

A method of generating high-power optical radiation using the external cavity laser source of the present invention includes providing a free space external cavity. The cavity includes at least two optical gain elements at one end of the cavity and a partially reflecting element at the other end of the cavity. An optical element and a dispersive element are positioned in the optical paths of the cavity.

The gain elements 14 are pumped with energy which is typically provided by electrical current or optical radiation. The gain elements each generate optical beams having one of at least a first and a second wavelength and one of at least a first and a second free space optical path, respectively. Each of the gain elements may generate at least 0.5 Watt of multi-mode optical radiation.

The pumped gain elements and the partially reflecting element together form an ensemble of individual external cavity lasers, each with its own gain element and optical path. An output beam including radiation having the at least first and second wavelength is transmitted through the partially reflecting element. The output beam is overlapping or coaxial in shape because all of the optical beams travel through the optical element such that their paths intercept at the location of the dispersive element and have a common path on the partial mirror 30 side of the dispersive element.

Since each of these individual external cavity lasers has its beam incident on the dispersive element at a different angle, each of the external cavity lasers has a different optical path and, therefore, each external cavity laser lases at a different wavelength. The wavelengths generated by each laser are a function of the center-to-center spacing of the gain elements and the properties of the dispersive element. The center-to-center spacing of the gain elements may be constant or variable. The wavelengths are tunable. One method of tuning the wavelengths of the lasers is to slightly tilt the partially reflecting element. This changes the angle of incidence of the optical beams on the dispersive element and thus changes the optical path lengths.

Another method of tuning the wavelengths of the external cavity lasers is to translate the gain elements sideways (up and down in figure according to arrow A). This also changes the angle of incidence of the optical beams on the grating and thus changes the optical path length. Tuning the wavelengths of lasers by translating the gain elements sideways is advantageous because translating the gain elements does not translate the output beam.

The tuning range depends on the gain bandwidth of the gain media and the reflectivity presented by the partially reflecting element. The number of gain elements and their location can be chosen so as to generate simultaneously or sequentially any set of wavelengths within the gain width of the gain media.

Figure 2:
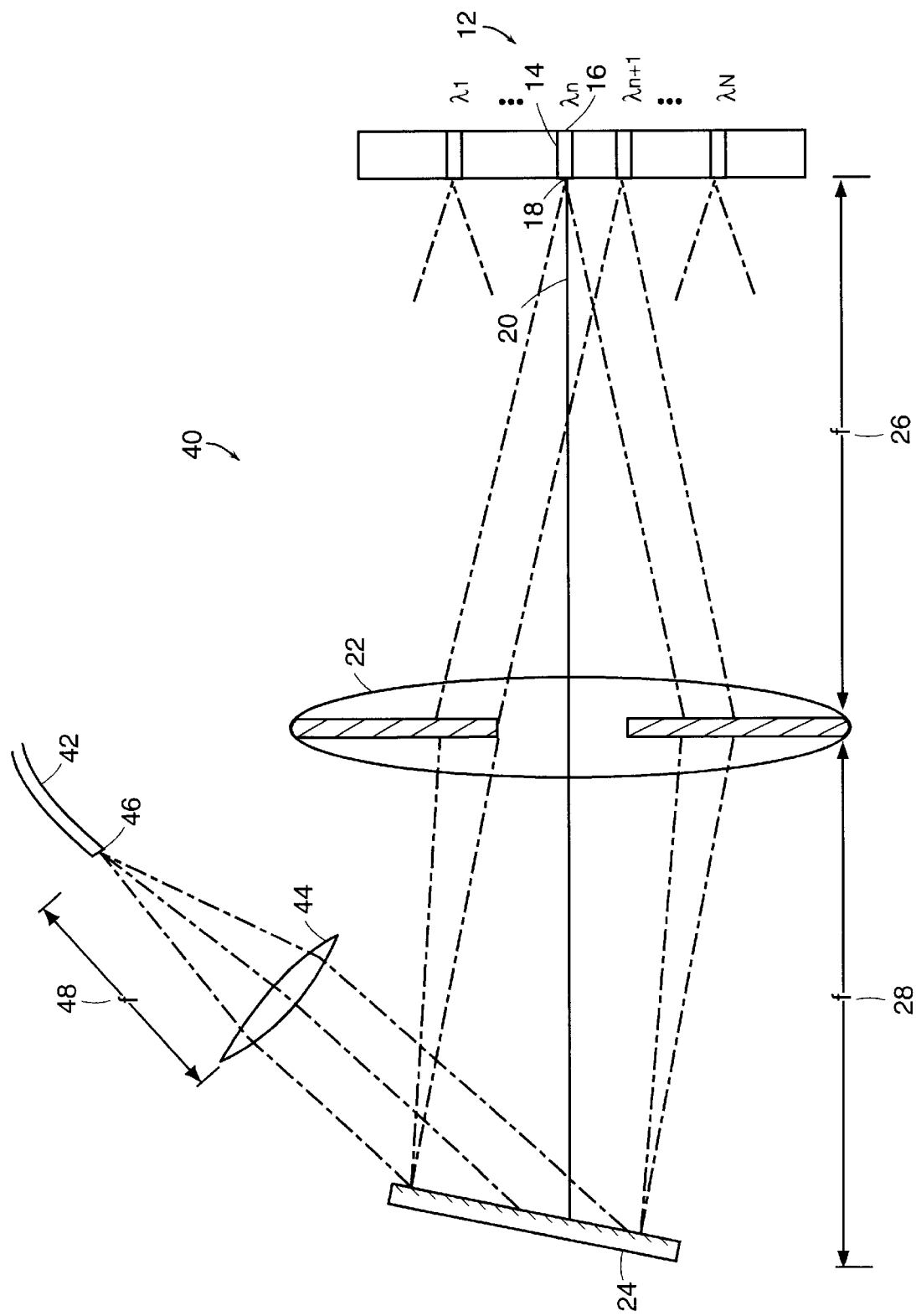
FIG. 2 illustrates a schematic diagram of an embodiment of a multi-wavelength external cavity laser according to the present invention that couples a high-power semiconductor laser source into an optical fiber.

FIG. 2 illustrates a schematic diagram of an embodiment of a multi-wavelength external cavity laser according to the present invention that couples a high-power semiconductor laser array into an optical fiber 42. The laser 40 of FIG. 2 is similar to the laser 10 of FIG. 1. The partially reflecting mirror 30 of FIG. 1 is replaced by a lens 44 which focuses the beams generated by gain elements 12 onto a partially reflecting end face 46 of the optical fiber 42. A resonator is formed by the reflecting surface of the rear face 16 of each of the gain elements 14 and the partially reflective end face 46 of the optical fiber 42. The optical fiber 42 is positioned a distance that is substantially equal to a focal length 48 away from the lens 44. The lens 44 is designed to focus the output beam into an angle that does not exceed the numerical aperture of the fiber 42.

Figure 3:
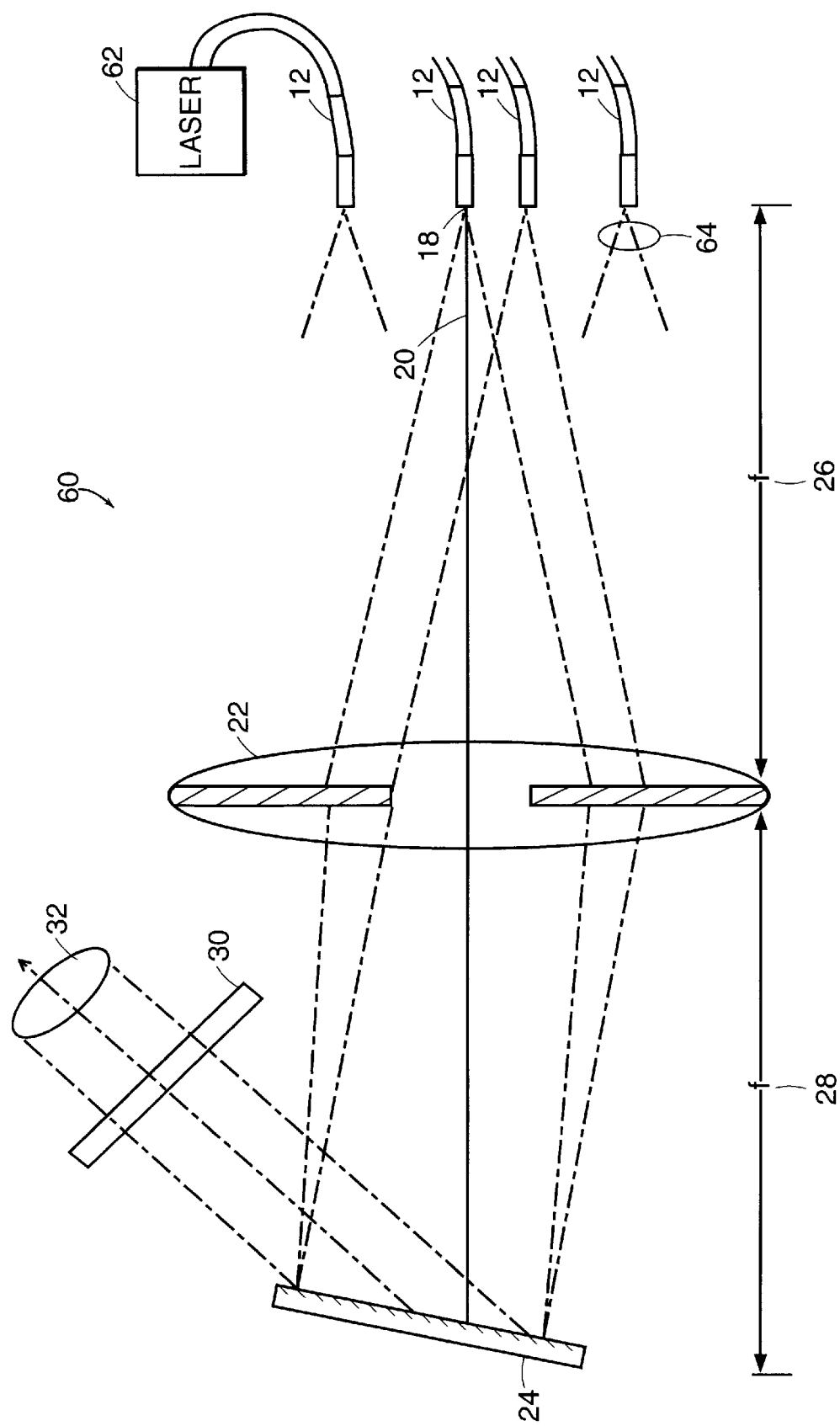
FIG. 3 illustrates a schematic diagram of an embodiment of a multi-wavelength external cavity laser according to the present invention that uses fiber amplifier gain elements.

FIG. 3 illustrates a schematic diagram of an embodiment of a multi-wavelength external cavity laser according to the present invention that uses fiber amplifier gain elements 14. The laser 60 of FIG. 3 is similar to the laser 10 of FIG. 1. The gain elements 14 include a plurality of fiber amplifiers. In operation, the fiber amplifiers are optically pumped by a pump laser 62. In one embodiment, focusing lenses 64 are positioned adjacent to the output of each of the fibers.

The present invention teaches a high-power or high-brightness, multi-wavelength semiconductor or fiber laser that generates an overlapping or coaxial beam that can be coupled into an optical fiber. The laser can be constructed with a semiconductor or fiber gain media, a wavelength dispersive element, and a partially reflecting element.

The present invention also features an external cavity laser source that uses spectral beam combining of singletransverse-mode gain elements such as semiconductor diode lasers and fiber to achieve high brightness and power. As a result of spectral beam combining, the spatial beam quality of the overall array is improved.

FIG. 4 illustrates a schematic diagram of an embodiment of a multi-wavelength external cavity laser 100 that uses single-transverse-mode gain elements to generate high brightness and high power. The laser 100 is similar to the laser 10 described in connection with FIG. 1. The laser array 12, however, includes single-transverse-mode gain elements. In one embodiment, the laser array 12 includes a single-transverse-mode semiconductor laser amplifier gain elements 14 of active gain media as shown in FIG. 4. In another embodiment, the array 12 includes a plurality of discrete single-transverse-mode semiconductor amplifiers. In yet another embodiment, the gain element array 12 includes a plurality of single mode fiber amplifiers.

As described in connection with FIG. 1, the gain elements 14 may be positioned on equal or unequal center-to-center spacing. Positioning the gain elements 14 on unequal spacing may reduce cross talk between the gain elements 14. Each of the gain elements may be substantially the same or different gain media. Each gain element 14 has a reflecting rear face 16 and a substantially antireflective front face 18. In one embodiment, the rear face 16 is substantially totally reflecting. Each of the gain elements 14 emit a beam of radiation in different optical paths 20. An optical element, such as a collimating lens 22, is positioned in the optical paths 20 of the beams at substantially a focal length 26 away from the array 12. In one embodiment, additional collimating lenses 23 are positioned adjacent to the front face 18 of each gain element 14. In one embodiment, the optical element includes a curved mirror (not shown).

A dispersive element, such as a diffraction grating 24, is positioned in the optical paths 20 at substantially a focal length 28 away from the lens 22. One advantage of the external cavity laser 100 is that cross-talk from adjacent gain elements 14 is effectively eliminated with this geometry. Positioning the dispersive element in the optical paths 20 at substantially a focal length 28 away from the lens 22 forces the footprint of the beams 20 from each gain element 14 to have good overlap on the dispersive element 24. This is because cross-talk between adjacent gain elements 14 occurs when there are closed optical paths between gain elements 14 resulting from a reflection off the partial mirror 30 at other than normal incidence. By forcing the footprints to overlap on the dispersive element 24, there are no such closed optical paths for single-transverse mode array elements.

A partially reflective element 30, such as a partial mirror 30, is positioned in the optical paths 20 so that it reflects the optical beams at near normal incidence. The partial mirror 30 reflects a portion of the beams emitted by the gain media 12 back into the optical paths 20. The partial mirror 30 also transmits a portion of the optical beams emitted by the gain elements 14 out of the laser 100.

A resonator is formed by the reflecting surface of the rear face 16 of each of the gain elements 14 and the partial mirror 30. The optical paths 20 of the laser 100 all pass through lens 22 and are all dispersed by grating 24. That is, the optical paths 20 all share lens 22 and grating 24, but pass through only one of the plurality of gain elements 14.

One advantage of the external cavity laser 100 is that it generates a nearly ideal spatial mode with minimal cross talk and, therefore, there is no need for an intracavity spatial filter 34 (FIG. 1) between the grating and output coupler for most application. Prior art lasers have used a focusing element and a waveguide operating in the plane of the array as an intracavity spatial filter. Eliminating the guided-wave portion results in a simpler laser geometry with increased efficiency.

FIG. 5 illustrates a schematic diagram of an embodiment of a multi-wavelength external cavity laser 150 that uses multi-traverse-mode gain elements and a spatial filter to generate a high quality and high brightness beam. The laser 100 is similar to the laser 100 described in connection with FIG. 4. The gain element array 12, however, includes multi-transverse-mode gain elements. In one embodiment, the array 12 includes multi-transverse-mode semiconductor laser amplifier gain elements 14 of active gain media as shown in FIG. 5. In another embodiment, the array 12 includes a plurality of discrete multi-transverse-mode semiconductor amplifiers. In yet another embodiment, the array 12 includes a plurality of multi-mode fiber amplifiers.

A spatial filter 152 is positioned in the external cavity in a region between the grating 24 and the partial mirror 158. In one embodiment, the spatial filter 152 includes a lens 154, an aperture 156, and partial mirror 158. Numerous other spatial filters known in the art may also be used.

The aperture 156 of the spatial filter 152 is positioned substantially at the location of an image of the gain elements 14. This image will have a magnification relative to an individual gain element (in the plane of the array 12) of M, such that the size of the image is Ma, where a is the emitting width of a gain element 14 in the plane of the array. The value of M is determined by the focal lengths of the lenses. If the aperture dimension is equal to or larger than Ma, then the beam quality of the output beam will be similar to that from the external cavity laser 10 of FIG. 1 without a spatial filter. However, if the aperture size is smaller than Ma, then the beam quality of the combined beam will be forced to be better than the beam quality of a single gain element 14.

As the aperture is decreased the power will not decrease proportional to the aperture size (at least until the aperture size is such that the beam quality approaches the diffraction limit), which means that the overall spatial brightness of the source will increase. As the aperture size of the spatial filter decreases from Ma the wavelength of emission across the aperture of a single array element is being forced to vary, just as the wavelength varies across the entire array, whereas for an aperture size of $\geq$Ma the wavelength of emission across a single array element will be nominally uniform. Substantial improvements in brightness can be expected by using such an implementation. A typical high-power array element has an emitting aperture of 100 $\mu$m or larger. For 1-$\mu$m wavelength, this emitting aperture translates into a beam quality in the plane of the array of around 15 times diffraction limited for the single array element. By using the spatial filter technique, the beam quality can approach the diffraction limit without inducing excessive loss, thereby increasing the brightness by around an order of magnitude relative to a spectrally beam combined array without the spatial filter.

The present invention also features a method of generating optical radiation using an external cavity laser source. At least two free space optical beams are generated with at least two optical gain elements. The at least two optical beams have at least a first and a second wavelength, respectively. In one embodiment, each of the at least two optical gain elements generate at least 0.5 Watt of optical radiation. The at least two optical beams are propagated to an optical element that intercepts the at least two optical beams substantially at a focal plane of the optical element.

The at least two optical beams propagate to a dispersive element that is positioned at the focal plane of the optical element. The at least two optical beams then propagate to a partially reflecting element. The partially reflecting element and the gain element together form a free space laser cavity that defines the at least first and second wavelength. An overlapping beam including radiation having the at least first and second wavelength is transmitted through the partially reflecting element. The overlapping beam may be a coaxial beam.

In one embodiment, a spatial filter is be used to improve the quality and increase the brightness of the overlapping beam. The overlapping beam including radiation having the at least first and second wavelength is transmitted through a spatial filter that is positioned between the dispersive element and the partially reflecting element before being transmitted through the partially reflecting element.

Equivalents

While the invention has been particularly shown and described with reference to specific preferred embodiments, it should be understood by those skilled in the art that various changes in form and detail may be made therein without departing from the spirit and scope of the invention as defined by the appended claims.

What is claimed is:

1. An external cavity laser source comprising:
    a) a free space external cavity comprising:
       i) an optical gain element array comprising at least two optical gain elements, each of the at least two optical gain elements generating optical radiation having a unique wavelength;
       ii) an optical element having a focal plane, the optical element positioned to substantially place the focal plane at the at least two optical gain elements and to intercept the generated optical radiation;
       iii) a dispersive element positioned substantially at the focal plane of the optical element; and
       iv) a partially reflecting element positioned to intercept radiation from the dispersive element,
    wherein the partially reflecting element and the gain elements together form the free space laser cavity that produces the at least first and second wavelengths, and
    wherein the partially reflecting element transmits an overlapping beam comprising radiation having the at least first and second wavelength.

2. The laser of claim 1 wherein the positioning of the dispersive element substantially at the focal plane of the optical element reduces cross talk between at least two optical gain elements.

3. The laser of claim 1 wherein the dispersive element comprises a grating.

4. The laser of claim 1 wherein the optical element comprises a refractive or a reflective element.

5. The laser of claim 1 wherein the partially reflecting element comprises an end face of an optical fiber.

6. The laser of claim 1 wherein the at least two optical gain elements each generate at least 0.5 Watt of optical radiation.

7. The laser of claim 1 wherein the overlapping beam comprises a coaxial beam.

8. The laser of claim 1 wherein the optical gain element array comprises a fiber laser array.

9. The laser of claim 1 wherein the optical gain element array comprises a semiconductor laser array.

10. The laser of claim 1 wherein the at least two optical gain elements comprises at least two multi-mode optical gain elements.

11. The laser of claim 1 wherein the at least two optical gain elements comprises at least two single mode optical gain elements.

12. The laser of claim 1 further comprising a spatial filter positioned in a path of the overlapping beam.

13. The laser of claim 12 wherein an etendue of the spatial filter is substantially less than or equal to the etendue of an optical gain element.

14. The laser of claim 12 wherein an aperture of the spatial filter comprises a partially reflecting element.

15. The laser of claim 12 wherein an aperture of the spatial filter comprises an end of an optical fiber.

16. A method of generating optical radiation using an external cavity laser source, the method comprising:
    b) generating at least two free space optical beams with at least two optical gain elements, the at least two optical beams having at least a first and a second wavelength, respectively;
    c) propagating the at least two optical beams to an optical element that intercepts the at least two optical beams, the optical element being positioned so that the at least two optical gain elements are positioned substantially at a focal plane of the optical element;
    d) propagating the at least two optical beams to a dispersive element positioned so that their footprints are substantially overlapping;
    e) propagating the at least two optical beams to a partially reflecting element positioned to receive radiation from the dispersive element, the partially reflecting element and the gain element together forming a free space laser cavity that produces the at least first and second wavelengths; and
    f) transmitting an overlapping beam comprising radiation having the at least first and second wavelength through the partially reflecting element.

17. The method of claim 16 further comprising the step of transmitting the overlapping beam through a spatial filter that is positioned between the dispersive element and the partially reflecting element.

18. The method of claim 16 wherein each of the at least two optical gain elements generate at least 0.5 Watt of optical radiation.

19. The method of claim 16 wherein the step of transmitting an overlapping beam comprises transmitting a coaxial beam.

20. A method of improving beam quality and increasing the brightness of an external cavity laser source, the method comprising:
    g) generating at least two free space optical beams with at least two optical gain elements, the at least two optical beams having at least a first and a second wavelength, respectively;
    h) propagating the at least two optical beams to an optical element that intercepts the at least two optical beams, the optical element being positioned so that the at least two optical gain elements are positioned substantially at a focal plane of the optical element;
    i) propagating the at least two optical beams to a dispersive element positioned so that their footprints are substantially overlapping;
    j) propagating the at least two optical beams to a partially reflecting element positioned to receive radiation from the dispersive element, the partially reflecting element and the gain element together forming a free space laser cavity that produces the at least first and second wavelengths;

k) transmitting an overlapping beam through a spatial filter that is positioned between the dispersive element and the partially reflecting element, thereby improving beam quality and increasing the brightness of the overlapping beam; and l) transmitting the overlapping beam comprising radiation having the at least first and second wavelengths through the partially reflecting element.

* * * * *